(12) United States Patent
Kuroda (10) Patent No.: US 8,830,774 B2
(45) Date of Patent: Sep. 9, 2014

(54) SEMICONDUCTOR MEMORY DEVICE (71) Applicant: Panasonic Corporation, Osaka (JP)

(72) Inventor: Naoki Kuroda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/865,011

(22) Filed: Apr. 17, 2013

(65) Prior Publication Data

US 2013/0229887 A1 Sep. 5, 2013

Related U.S. Application Data

(63) Continuation of application No. PCT/JP2011/005991, filed on Oct. 26, 2011.

(30) Foreign Application Priority Data

Dec. 16, 2010 (JP) ................................. 2010-280989

(51) Int. Cl.
*G11C 7/02* (2006.01)
*G11C 7/06* (2006.01)
*G11C 11/419* (2006.01)
G11C 7/18 (2006.01)
G11C 7/12 (2006.01)

(52) U.S. Cl.
CPC *G11C 7/062* (2013.01); *G11C 7/18* (2013.01); *G11C 11/419* (2013.01); *G11C 7/12* (2013.01)
USPC .................. 365/207; 365/185.12; 365/185.22; 365/185.11; 365/189.14; 365/196

(58) Field of Classification Search
CPC ........ G11C 11/419; G11C 7/062; G11C 7/18; G11C 16/10; G11C 16/3454; G11C 16/08; G11C 7/22; G11C 7/06; G11C 11/4091

USPC ............ 365/185.12, 185.22, 185.11, 189.14, 365/196, 207
See application file for complete search history.

(56) References Cited

U.S. PATENT DOCUMENTS 5,973,973 A * 10/1999 Utsugi ......................... 365/205
2008/0137393 A1 6/2008 Fukano
(Continued)

FOREIGN PATENT DOCUMENTS

JP 11-134855 A 5/1999
JP 2000-207886 A 7/2000
(Continued)

OTHER PUBLICATIONS

International Search Report issued in International Patent Application No. PCT/JP2011/005991 dated Jan. 17, 2012.

(Continued)

*Primary Examiner* — Fernando Hidalgo
(74) *Attorney, Agent, or Firm* — McDermott Will & Emery LLP (57) ABSTRACT

In a static random access memory (SRAM) device having a hierarchical bit line architecture, a local sense amplifier (SA) circuit includes P-channel transistors which precharge local bit lines connected to memory cells, P-channel transistors each having a gate connected to a corresponding one of the local bit lines and a drain connected to a corresponding one of global bit lines, and N-channel transistors each having a gate connected to a corresponding one of the global bit lines and a drain connected to a corresponding one of the local bit lines. As a result, restore operation to a non-selected memory cell during write operation can be achieved without the need of a fine timing control, the speed of read operation by a feedback function can be increased, and the area can be reduced.

6 Claims, 9 Drawing Sheets

(56) References Cited

U.S. PATENT DOCUMENTS

2010/0091590 A1     4/2010   Takeda  
2013/0051170 A1*   2/2013   Kuroda ........................ 365/207

FOREIGN PATENT DOCUMENTS

| | | |
|---|---|---|
| JP | 2007-004888 A | 1/2007 |
| JP | 2008-146734 A | 6/2008 |
| JP | 2010-113793 A | 5/2010 |
| WO | WO-2008/032549 A1 | 3/2008 |

OTHER PUBLICATIONS

Takeda, K. et al. "Multi-step Word-line Control Technology in Hierarchical Cell Architecture for Scaled-down High-denisty SRAMs". Technical Digest of Technical Papers, 2010 Symposium on VLSI Circuits. pp. 101-102.

* cited by examiner

SEMICONDUCTOR MEMORY DEVICE

CROSS-REFERENCE TO RELATED APPLICATIONS

This is a continuation of PCT International Application PCT/JP2011/005991 filed on Oct. 26, 2011, which claims priority to Japanese Patent Application No. 2010-280989 filed on Dec. 16, 2010. The disclosures of these applications including the specifications, the drawings, and the claims are hereby incorporated by reference in their entirety.

BACKGROUND

The present disclosure relates to semiconductor memory devices, and more particularly, to a semiconductor memory device in which the number of components is reduced while data destruction in a non-selected memory cell during data write operation is reduced.

In conventional static random access memory (SRAM) devices, the further miniaturization of transistors included in a memory cell would increase significant variations in transistor characteristics, disadvantageously leading to destruction of data stored by the memory cell during memory operation.

There is a technique of reducing or preventing data destruction during read operation in which bit lines are provided for write operation and read operation separately. There is also a technique of reducing or preventing data destruction in a non-selected memory cell during write operation in which data read from the non-selected memory cell is written back to the non-selected memory cell (restore or write-back technique) (see Japanese Patent Publication No. 2007-4888 and International Publication WO/2008/032549).

On the other hand, there is also a known technique of using a hierarchical bit line architecture in which a local bit line connected directly to a memory cell has a short line length, and a local sense amplifier (SA) circuit is provided for each local bit line (see Japanese Patent Publication No. 2000-207886 and K. Takeda, et al., "Multi-step Word-line Control Technology in Hierarchical Cell Architecture for Scaled-down High-density SRAMs," Technical Digest of Technical Papers, 2010 Symposium on VLSI Circuits, pp. 101-102).

A local SA circuit provided in the conventional hierarchical bit line architecture includes 22 components for each bit line when the local SA circuit is of single end type (see Japanese Patent Publication No. 2000-207886), and eight components for each bit line when the local SA circuit is of cross-coupled type (see K. Takeda, et al.). The area overhead of the SRAM device is disadvantageously large.

SUMMARY

The present disclosure describes implementations of a semiconductor memory device in which the number of components in the SA circuit while data destruction in the memory cell is reduced or prevented.

An example semiconductor memory device includes a first and a second signal line forming a pair of signal lines, a third and a fourth signal line forming another pair of signal lines, a memory cell connected to the first and second signal lines, and an SA circuit provided between the first and second signal lines and the third and fourth signal lines. The SA circuit includes six transistors, i.e., a first transistor of a first conductivity type having a gate connected to a precharge signal, a source connected to a first power supply potential, and a drain connected to the first signal line, a second transistor of the first conductivity type having a gate connected to the precharge signal, a source connected to the first power supply potential, and a drain connected to the second signal line, a third transistor of the first conductivity type having a gate connected to the first signal line, a source connected to the first power supply potential, and a drain connected to the third signal line, a fourth transistor of the first conductivity type having a gate connected to the second signal line, a source connected to the first power supply potential, and a drain connected to the fourth signal line, a fifth transistor of a second conductivity type having a gate connected to the third signal line, a source connected to a second power supply potential, and a drain connected to the first signal line, and a sixth transistor of the second conductivity type having a gate connected to the fourth signal line, a source connected to the second power supply potential, and a drain connected to the second signal line.

Another example semiconductor memory device includes memory cells, bit lines each connected to corresponding ones of the memory cells, and sense amplifier circuits each connected to corresponding ones of the bit lines. Each of the sense amplifier circuits has a single-end configuration and a function of writing data read from a corresponding one of the memory cells back to the corresponding bit lines, and achieves data write operation to a corresponding one of the memory cells by the function of writing data back to the corresponding bit lines.

According to the present disclosure, the function of writing data stored by a non-selected memory cell during write operation back to the memory cell without the need of a fine timing control is provided, whereby a semiconductor memory device can be provided in which the number of components in the SA circuit is reduced while data destruction in the memory cell is reduced or prevented.

DETAILED DESCRIPTION

Embodiments of the present disclosure will be described in detail hereinafter with reference to the accompanying drawings. Note that the same or like parts are indicated by the same reference characters and will not be redundantly described in the embodiments described below.

First Embodiment

Figure 1:
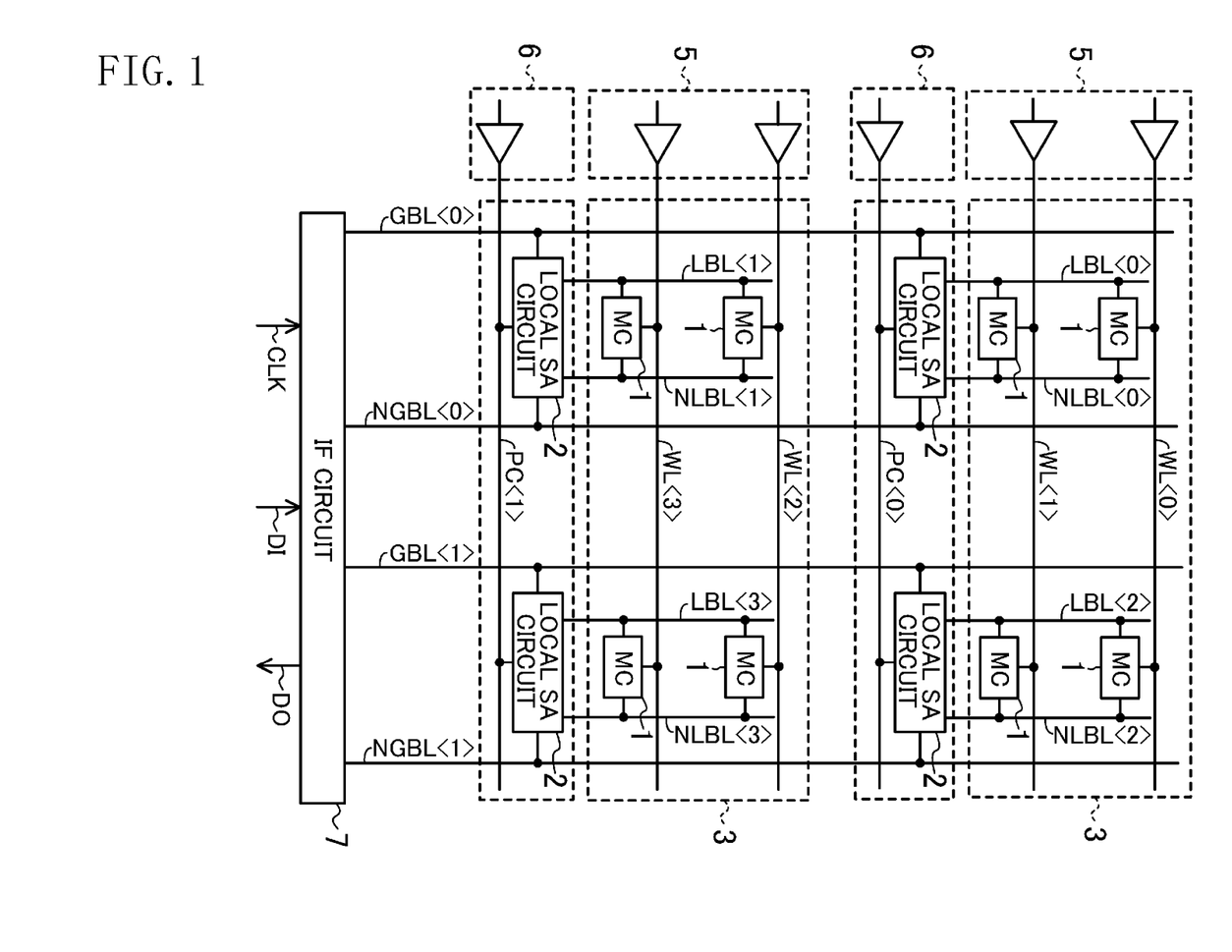
FIG. 1 is a block diagram showing a main configuration of a semiconductor memory device according to a first embodiment of the present disclosure.

FIG. 1 is a block diagram showing a main configuration of a semiconductor memory device according to a first embodiment of the present disclosure. The semiconductor memory device of FIG. 1 includes memory cells (MCs) 1, memory cell arrays 3 in which the memory cells 1 are arranged in a matrix, word lines WL<0>-WL<3> which are used to control input and output of data in the memory cells 1, a row decoder 5 which selects and activates the word lines, local SA circuits 2, local bit lines (pairs of signal lines) LBL<0>/NLBL<0>- LBL<3>/NLBL<3> which connect the memory cells 1 and the local SA circuits 2, local SA control circuits 6 which control precharge signals PC<0>-PC<1> of the local SA circuits 2, global bit lines (pairs of signal lines) GBL<0>/ NGBL<0> and GBL<1>/NGBL<1> connected to the local SA circuits 2, an interface (IF) circuit 7 which has a function of selecting one of the global bit line pairs GBL<0>/ NGBL<0> and GBL<1>/NGBL<1>, and a clock signal CLK, a data input signal DI, and a data output signal DO which are connected to the IF circuit 7. Although FIG. 1 shows only eight memory cells 1 for the sake of simplicity, any number of memory cells 1 may be provided. Also, any numbers of word lines, local bit lines, and global bit lines may be provided.

In particular, FIG. 1 shows the semiconductor memory device having a hierarchical bit line architecture which includes the local bit lines LBL<0>/NLBL<0>-LBL<3>/ NLBL<3> which are connected directly to the memory cells 1 arranged in specific groups and have a short line length, and the global bit lines GBL<0>/NGBL<0> and GBL<1>/ NGBL<1> which are provided on the memory cell arrays 3 and connected to all the local bit lines via the local SA circuits 2 and have a long line length.

Figure 2:
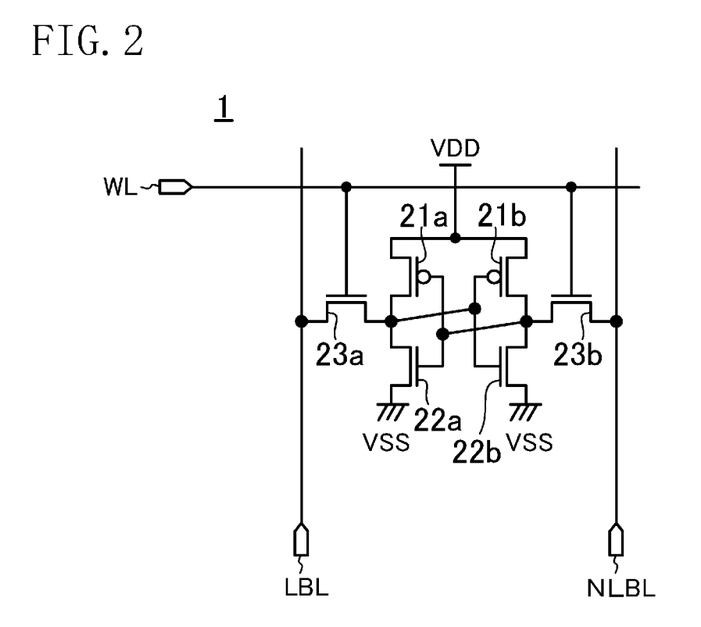
FIG. 2 is a circuit diagram showing a detailed example configuration of a memory cell of FIG. 1.

FIG. 2 is a circuit diagram showing a detailed example configuration of the memory cell 1 of FIG. 1. As shown in FIG. 2, the memory cell 1 includes a first cell transistor 21a, a second cell transistor 21b, a third cell transistor 22a, a fourth cell transistor 22b, a fifth cell transistor 23a, and a sixth cell transistor 23b. The first cell transistor 21a is a P-channel transistor having a source connected to a VDD potential, a drain connected to a first memory node, and a gate connected to a second memory node. The second cell transistor 21b is a P-channel transistor having a source connected to the VDD potential, a drain connected to the second memory node, and a gate connected to the first memory node. The third cell transistor 22a is an N-channel transistor having a source connected to a VSS potential, a drain connected to the first memory node, and a gate connected to the second memory node. The fourth cell transistor 22b is an N-channel transistor having a source connected to the VSS potential, a drain connected to the second memory node, and a gate connected to the first memory node. The fifth cell transistor 23a is an N-channel transistor having a source connected to the first memory node, a drain connected to the local bit line LBL, and a gate connected to the word line WL. The sixth cell transistor 23b is an N-channel transistor having a source connected to the second memory node, a drain connected to the local bit line NLBL, and a gate connected to the word line WL.

Figure 3:
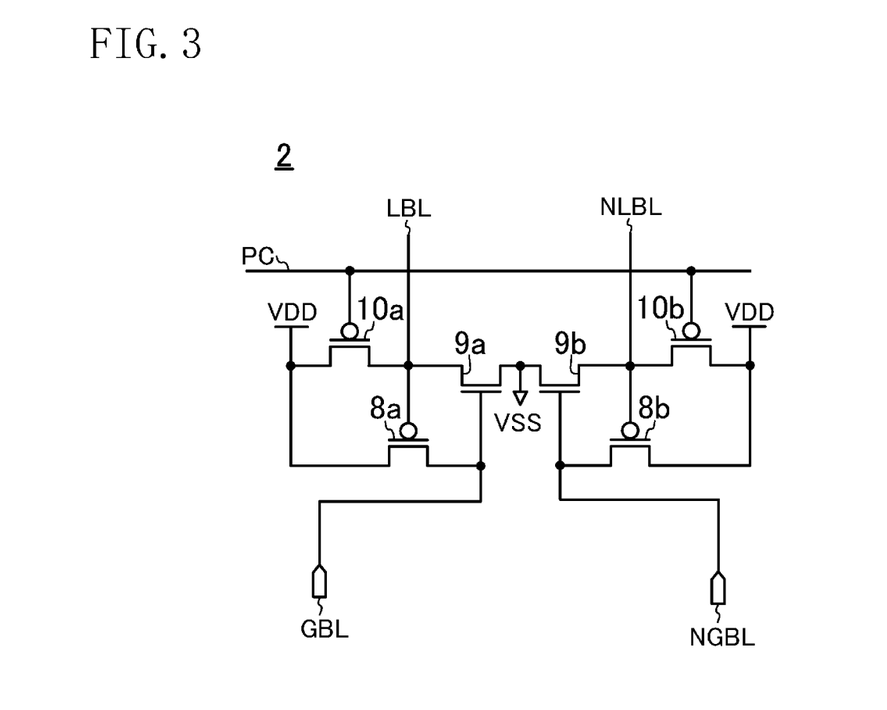
FIG. 3 is a circuit diagram showing a detailed example configuration of a local SA circuit of FIG. 1.

FIG. 3 is a circuit diagram showing a detailed example configuration of the local SA circuit 2 of FIG. 1. As shown in FIG. 3, the local SA circuit 2 includes a first transistor 10a, a second transistor 10b, a third transistor 8a, a fourth transistor 8b, a fifth transistor 9a, and a sixth transistor 9b. The first transistor 10a is a P-channel transistor having a gate connected to the precharge signal PC, a source connected to the VDD potential, and a drain connected to the local bit line LBL. The second transistor 10b is a P-channel transistor having a gate connected to the precharge signal PC, a source connected to the VDD potential, and a drain connected to the local bit line NLBL. The third transistor 8a is a P-channel transistor having a gate connected to the local bit line LBL, a source connected to the VDD potential, and a drain connected to the global bit line GBL. The fourth transistor 8b is a P-channel transistor having a gate connected to the local bit line NLBL, a source connected to the VDD potential, and a drain connected to the global bit line NGBL. The fifth transistor 9a is an N-channel transistor having a gate connected to the global bit line GBL, a source connected to the VSS potential, and a drain connected to the local bit line LBL. The sixth transistor 9b is an N-channel transistor having a gate connected to the global bit line NGBL, a source connected to the VSS potential, and a drain connected to the local bit line NLBL.

As described above, the local SA circuit 2 of FIG. 3 is controlled based on the precharge signal PC, and includes the P-channel transistors 10a and 10b for precharging the local bit lines LBL and NLBL to a high level (a power supply potential or the VDD potential), the P-channel transistors 8a and 8b for transferring to the global bit lines GBL and NGBL data driven depending on the potential levels of the local bit lines LBL and NLBL, respectively, and the N-channel transistors 9a and 9b for transferring to the local bit lines LBL and NLBL data driven depending on the potential levels of the global bit lines GBL and NGBL, respectively. Each of the pair of the P-channel transistor 8a and the N-channel transistor 9a and the pair of the P-channel transistor 8b and the N-channel transistor 9b has a feedback structure in which data is fed back, depending on the potential level.

Figure 4:
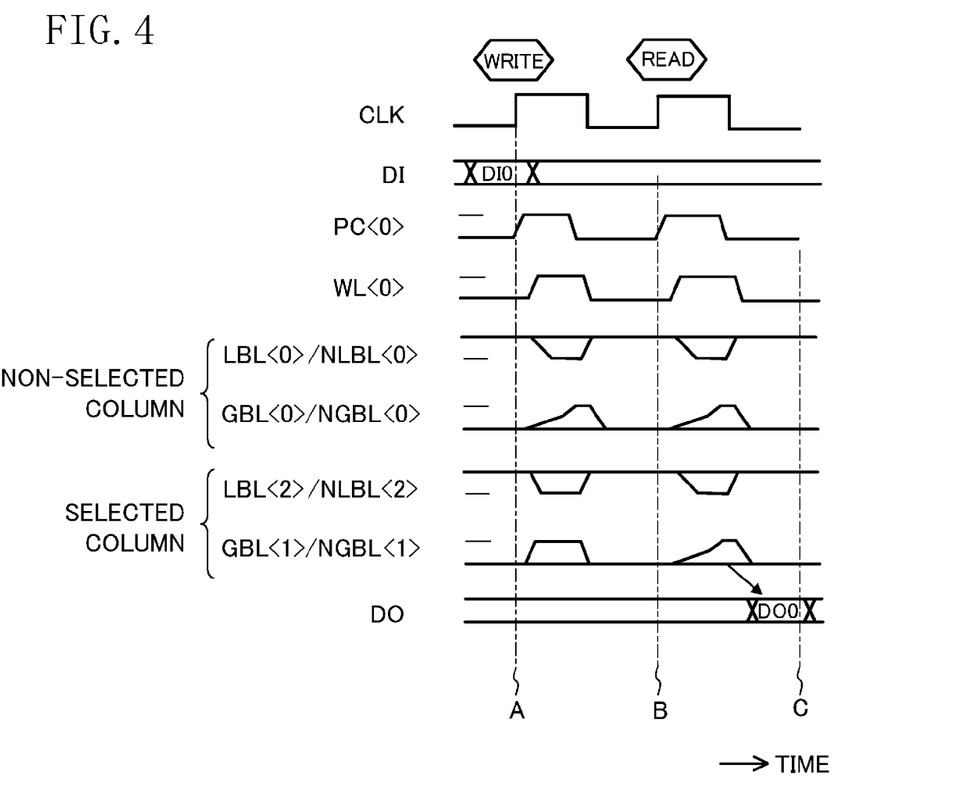
FIG. 4 is a timing chart showing main operation of the semiconductor memory device of the first embodiment of the present disclosure.

FIG. 4 is a timing chart showing main operation of the semiconductor memory device of the first embodiment of the present disclosure. Write operation and read operation of the semiconductor memory device having the above configuration will be described with reference to the timing chart of FIG. 4.

Initially, when a write command is externally input at time A, write operation is performed. When data DI0 is input from the data input signal DI, the data DI0 is transferred to the global bit lines GBL<1> and NGBL<1> selected by the IF circuit 7. Next, when the precharge signal PC<0> goes high, precharge operation to the local bit lines of the local SA circuit 2 connected to the precharge signal PC<0> becomes inactive. Next, when the word line WL<0> is activated to a high signal, the memory cells 1 connected to the word line WL<0> are connected to the respective corresponding local bit line pairs LBL<0>/NLBL<0> and LBL<2>/NLBL<2>. At this time, when the voltage of the global bit line GBL<1> which is a signal of a selected column exceeds the threshold voltage of the N-channel transistor so that the logical value of the global bit line GBL<1> goes high, only the N-channel transistor 9a in the local SA circuit 2 is activated, and only the local bit line LBL<2> is pulled down to a ground potential (the VSS potential), i.e., low data is written. At this time, when the low level of the local bit line LBL<2> becomes higher than or equal to the threshold voltage of the P-channel transistor, the P-channel transistor 8a writes high data to the global bit line GBL<0> (i.e., a so-called feedback function), thereby assisting in increasing the transfer rate of data to the local SA circuit 2 in addition to the normal operation.

Because the global bit line NGBL<1> is low, the N-channel transistor 9b in the local SA circuit 2 is not activated.

On the other hand, the global bit lines GBL<0> and NGBL<0> connected to the non-selected column are in a state (Hi-Z state) released from the precharged state and are on standby. In other words, although write operation is not performed on the memory cells 1 connected to the local bit lines LBL<0> and NLBL<0>, the memory cell 1 and the local bit lines LBL<0> and NLBL<0> are connected together by the word line WL<0>, which state is a so-called half-selected state during write operation. Initially, data stored by the memory cell 1 connected to the word line WL<0> is read out to the local bit lines LBL<0> and NLBL<0>. At this time, when the voltage of the local bit line LBL<0> exceeds the threshold voltage of the P-channel transistor to go low, the P-channel transistor 8a of the local SA circuit 2 is activated to cause the global bit line GBL<0> to go high. As a result, when the global bit line GBL<0> exceeds the threshold voltage of the N-channel transistor, the N-channel transistor 9a is activated to perform feedback operation to cause the local bit line LBL<0> to go low. Because the local bit line NLBL<0> is high, the P-channel transistor 8b of the local SA circuit 2 is not activated, and therefore, the global bit line NGBL<0> is also maintained low, and the P-channel transistor 9b is not activated, so that the local bit line NLBL<0> is maintained high.

Next, when a read command is externally input at time B, read operation is performed. When the precharge signal PC<0> goes high, precharge operation to the local bit lines of the local SA circuit 2 connected thereto is inactivated. Next, when the word line WL<0> is activated to a high signal, the memory cells 1 connected thereto are connected to the respective corresponding local bit line pairs LBL<0>/NLBL<0> and LBL<2>/NLBL<2>. Operation of transferring data to the global bit lines GBL<0> and NGBL<0> using the local SA circuit 2 is exactly the same as operation of transferring data to the global bit lines GBL<1> and NGBL<1>, and therefore, only the global bit lines GBL<0> and NGBL<0> will be described. In this case, when data stored by the memory cell 1 causes the voltage of the local bit line LBL<0> to exceed the threshold voltage of the P-channel transistor, i.e., the local bit line LBL<0> goes low, the P-channel transistor 8a of the local SA circuit 2 is activated, so that high data is transferred to the global bit line GBL<0>. At the same time, when the voltage of the global bit line GBL<0> exceeds the threshold voltage of the N-channel transistor, i.e., the global bit line GBL<0> goes high, the N-channel transistor 9a is activated, so that by feedback operation, the local bit line LBL<0> is pulled down to go low. On the other hand, data stored by the memory cell 1 causes the local bit line NLBL<0> to be maintained high, and therefore, the P-channel transistor 8b of the local SA circuit 2 is not activated, and therefore, the global bit line NGBL<0> is also maintained low. At the same time, the N-channel transistor 9b is not activated. By the above operation, data read from the memory cell 1 is transferred to the global bit lines GBL<0> and NGBL<0>, and similarly, data is transferred to the global bit lines GBL<1> and NGBL<1>. One of the two pieces of data is selected by the IF circuit 7 and is output as the output data DO0 from the data output signal DO to circuitry external to the memory device (time C).

As described above, in the non-selected memory cell 1 during write operation, only low data read from the memory cell 1 is automatically restored by the feedback function which is performed by the P-channel transistor 8a and the N-channel transistor 9a, or the P-channel transistor 8b and the N-channel transistor 9b, in the local SA circuit 2. Therefore, the static noise margin (SNM) of the non-selected memory cell 1 is significantly improved.

The N-channel transistors 9a and 9b in the local SA circuit 2 function as a write buffer circuit during write operation. However, the interconnect load of the local bit line is considerably small, and only one stage of N-channel transistor is provided. Therefore, a sufficient level of write performance can be achieved, and a large driver size is not required, whereby the area can be effectively reduced.

The signal transferred to the global bit line selected during write operation may be a control signal for the N-channel transistors 9a and 9b for writing data to the memory cell 1 via the local bit line, and therefore, a high level of drive performance is not required. This means that it is not necessary to increase a driver circuit which drives a control signal included in the IF circuit 7 for the global bit line whose interconnect load is relatively large because the global bit line is provided on the memory cell array 3, and therefore, the memory area and the instantaneously consumed current can be effectively reduced. As the control signal transferred to the global bit line, low (ground potential or VSS) precharge is used on the global bit line, and therefore, high data only needs to be driven. Therefore, the performance of the N-channel transistor included in the driver circuit can be further reduced, and therefore, it is expected that the area can be advantageously reduced. By the feedback function in the local SA circuit 2 (i.e., the local bit line is pulled down by the transfer of high data on the global bit line, so that the global bit line is pulled up to go high), the driver circuit can assist the global bit line in going high, whereby the speed of transmission of the control signal can be increased, and the area of the driver circuit can be reduced. In particular, write operation of the SRAM memory cell typically tends to be most difficult under processing conditions that the threshold voltage of the P-channel transistor is low and the threshold voltage of the N-channel transistor is high. Under the processing conditions, in this semiconductor memory device in which the global bit line having a large load is driven to the high level, i.e., the P-channel transistor is activated, the speed can be advantageously increased compared to when the bit line having a large load is driven by the N-channel transistor. Moreover, in this semiconductor memory device in which the N-channel transistor only drives the local bit lines having a low load, the write performance can be improved compared to the conventional art.

Next, during read operation, low data read to the local bit line can be transferred to the global bit line by the P-channel transistor without an unnecessary timing control. Therefore, in particular, this is considerably effective compared to the difficulty in the control of activation timing of a conventional cross-coupled SA circuit during high-speed operation, and high-speed operation can be achieved while the number of components can be reduced, and therefore, the area can be effectively reduced. When high data is read to the global bit lines, the local bit lines are pulled down by the feedback function of the N-channel transistors 9a and 9b, resulting in higher-speed read operation which may assist in read operation of low data to the local bit lines.

For the non-selected memory cell during read operation, the SNM can be significantly improved by the restore function which can be achieved by the local SA circuit 2 in the non-selected memory cell.

Compared to the conventional cross-coupled SA circuit, the local SA circuit 2 of FIG. 3 can be implemented by a small number of components, and operation can be achieved without complicated activation timing (timing-free operation), whereby a reduction in area and an increase in speed can be simultaneously achieved. In particular, in the hierarchical bit line architecture of FIG. 1 in which the interconnect load of the local bit line is reduced so that, during read operation, the potential levels of the local bit lines quickly exceed the threshold voltages of the P-channel transistors 8a and 8b, the speed of the memory device can be effectively increased.

Note that even if the local SA circuit 2 of FIG. 3 is used in a bit line configuration which is not of hierarchical type on the memory cell array 3, the area can be effectively reduced and the control timing can be effectively facilitated.

The local SA circuit 2 may be provided between the separated memory cell arrays 3. Moreover, by arranging the two local SA circuits 2 to be adjacent to each other, the number of layout separation regions between the local SA circuit 2 and the memory cell array 3 can be halved, whereby the area can be effectively reduced.

Although only the precharge signal PC<0> is high in this embodiment, all of the precharge signals PC<0>-PC<1> may be simultaneously high in order to reduce or avoid an increase in a through current during write operation.

Although the SRAM memory cell is illustrated in this embodiment, the present disclosure is, of course, applicable to any memory devices that require similar memory operation.

Second Embodiment

Figure 5:
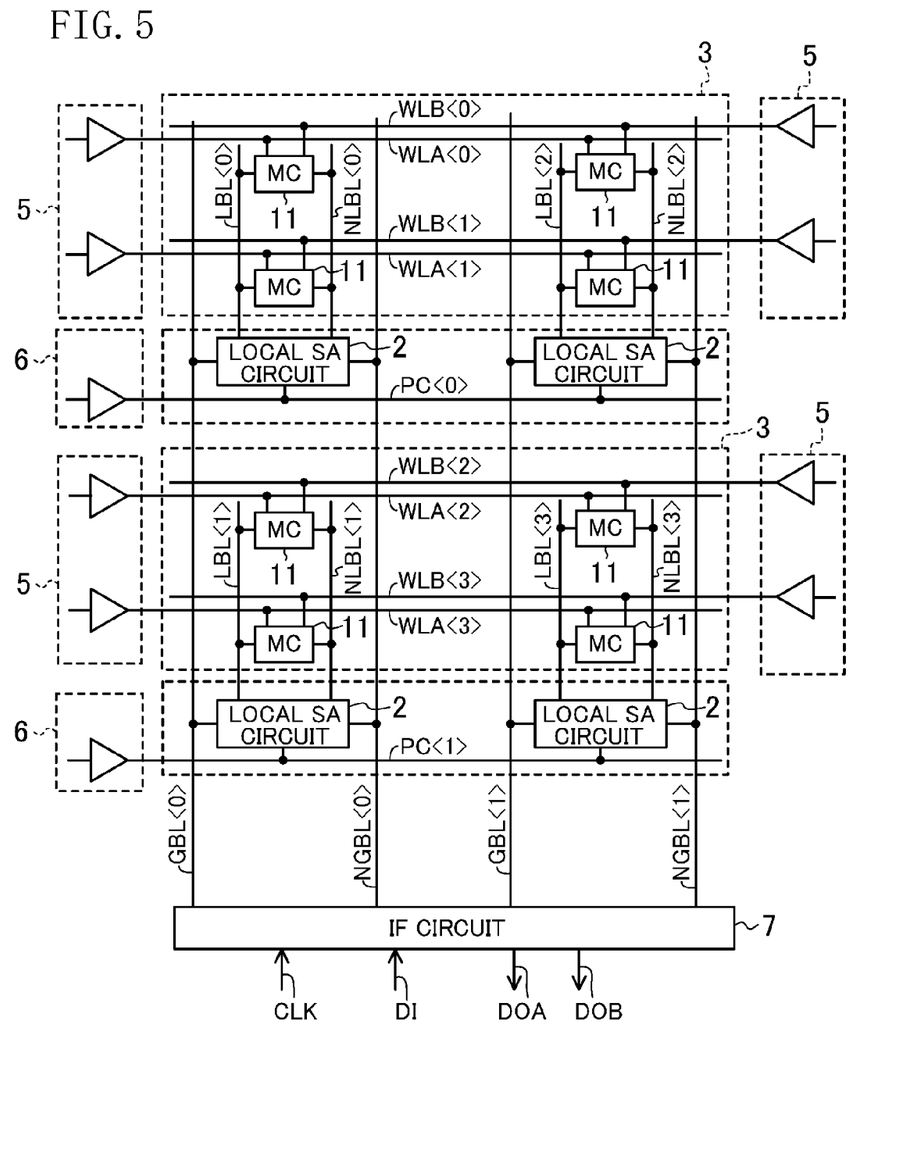
FIG. 5 is a block diagram showing a main configuration of a semiconductor memory device according to a second embodiment of the present disclosure.
Figure 6:
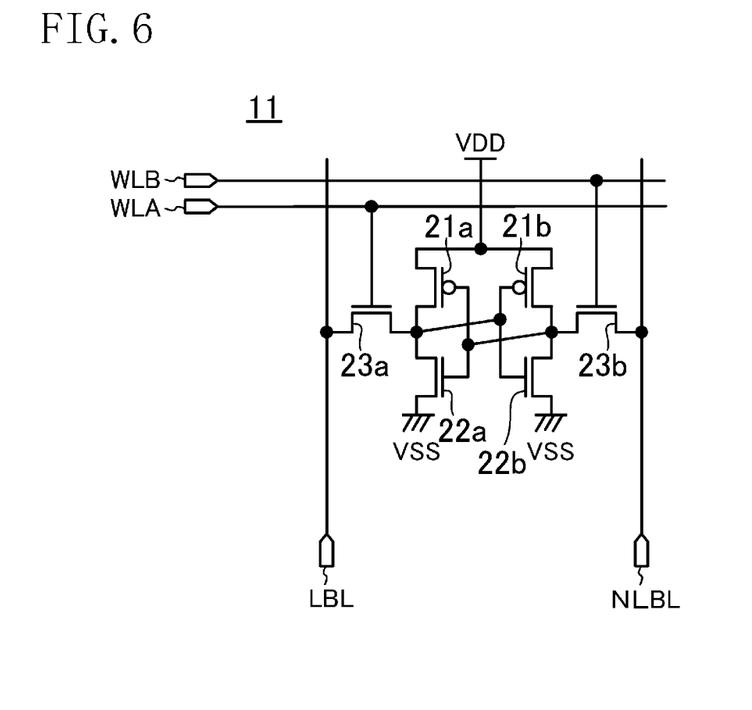
FIG. 6 is a circuit diagram showing a detailed example configuration of a memory cell of FIG. 5.

FIG. 5 is a block diagram showing a main configuration of a semiconductor memory device according to a second embodiment of the present disclosure. FIG. 6 is a circuit diagram showing a detailed example configuration of a memory cell 11 of FIG. 5. The second embodiment is clearly different from the first embodiment in that the memory cell 11 of the second embodiment includes word lines WLA and WLB shown in FIG. 6.

As shown in FIG. 6, the memory cell 11 includes a first cell transistor 21a, a second cell transistor 21b, a third cell transistor 22a, a fourth cell transistor 22b, a fifth cell transistor 23a, and a sixth cell transistor 23b. The first cell transistor 21a is a P-channel transistor having a source connected to the VDD potential, a drain connected to the first memory node, and a gate connected to the second memory node. The second cell transistor 21b is a P-channel transistor having a source connected to the VDD potential, a drain connected to the second memory node, and a gate connected to the first memory node. The third cell transistor 22a is an N-channel transistor having a source connected to the VSS potential, a drain connected to the first memory node, and a gate connected to the second memory node. The fourth cell transistor 22b is an N-channel transistor having a source connected to the VSS potential, a drain connected to the second memory node, and a gate connected to the first memory node. The fifth cell transistor 23a is an N-channel transistor having a source connected to the first memory node, a drain connected to the local bit line LBL, and a gate connected to the first word line WLA. The sixth cell transistor 23b is an N-channel transistor having a source connected to the second memory node, a drain connected to the local bit line NLBL, and a gate connected to the second word line WLB different from the first word line WLA.

Figure 7:
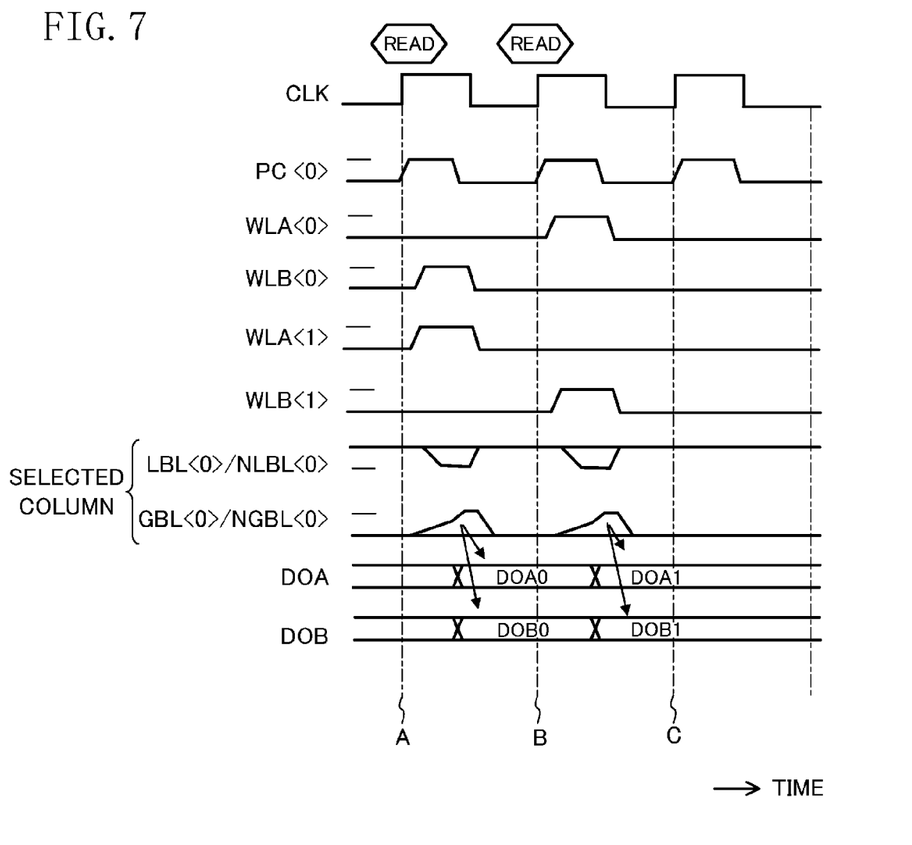
FIG. 7 is a timing chart showing main operation of the semiconductor memory device of the second embodiment of the present disclosure.

FIG. 7 is a timing chart showing main operation of the semiconductor memory device of the second embodiment of the present disclosure. Read operation of the semiconductor memory device having the above configuration will be described with reference to the timing chart of FIG. 7.

Initially, when a read command is externally input at time A, read operation is performed. When the precharge signal PC<0> goes high, precharge operation to the local bit lines of the local SA circuit 2 connected thereto becomes inactive. Next, the word lines WLA<1> and WLB<0> are activated to the high signal, the memory cells 11 connected thereto are connected to the respective corresponding local bit line pairs LBL<0>/NLBL<0> and LBL<2>/NLBL<2>. The operation of transferring data to the global bit lines GBL<0> and NGBL<0> and the global bit lines GBL<1> and NGBL<1> using the local SA circuits 2 is the same as that of the first embodiment and will not be described. At this time, data on the local bit line NLBL<0> read from the memory cell 11 connected to the word line WLB<0>, and data on the local bit line LBL<2> read from the memory cell 11 connected to the word line WLA<1>, are transferred to the global bit lines NGBL<0> and GBL<1> because the memory cells are in the non-selected state, and are not output as output data by the IF circuit 7 performing the non-selection control. In other words, only data on the local bit lines LBL<0> and NLBL<2> are output, i.e., data can be simultaneously read from different memory cells 11 (multiport memory function).

Next, the same operation is preformed from time B to time C, except that the word lines WLA<0> and WLB<1> are activated.

As described above, data can be simultaneously read to data output signals DOA and DOB from two different memory cells during read operation, i.e., a multiport memory device can be easily obtained. In particular, a multiport memory device can be implemented using the memory cell 11 of FIG. 6 including six transistors. Therefore, the area can be significantly reduced compared to a conventional multiport memory device including eight transistors.

Third Embodiment

Figure 8:
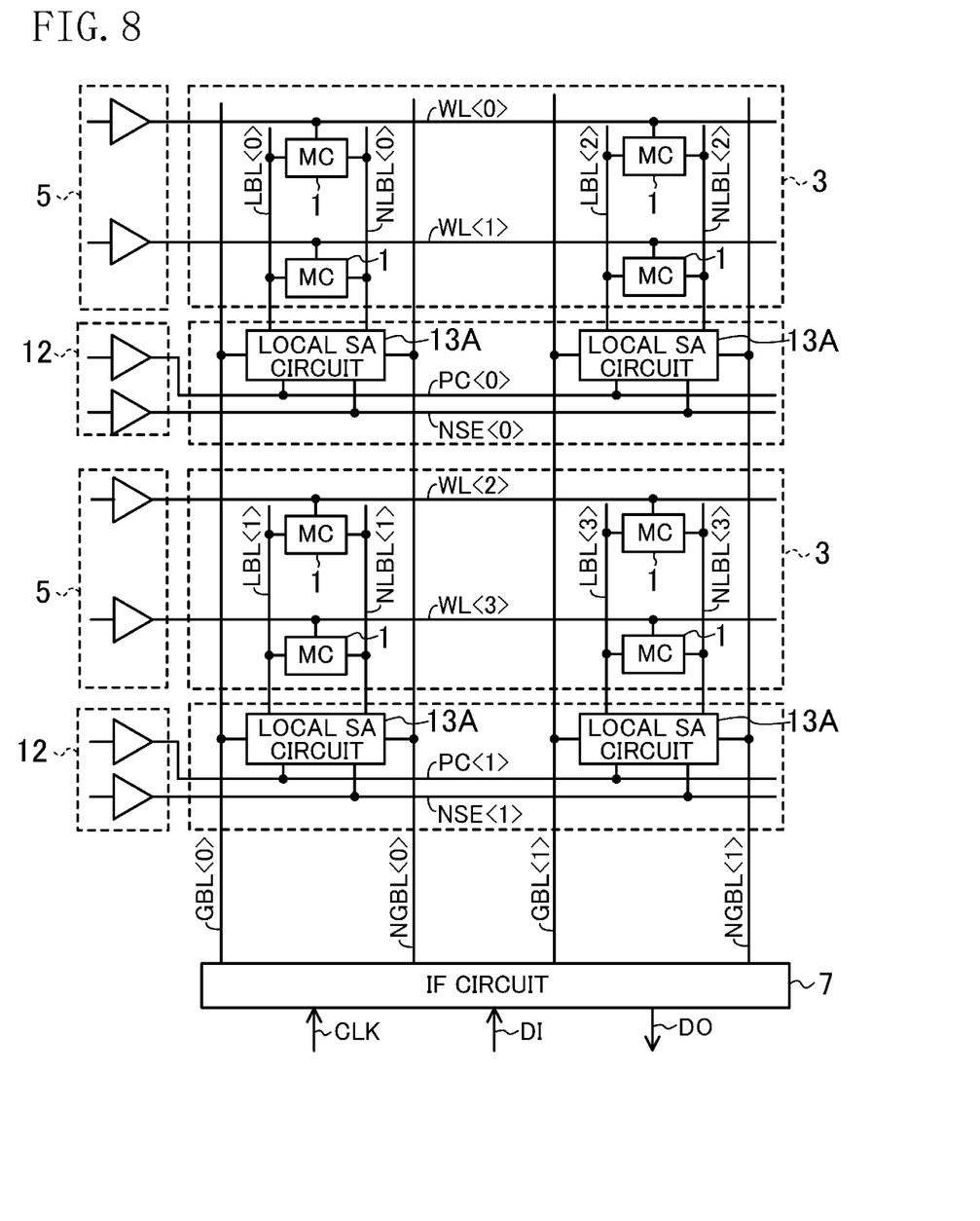
FIG. 8 is a block diagram showing a main configuration of a semiconductor memory device according to a third embodiment of the present disclosure.
Figure 9:
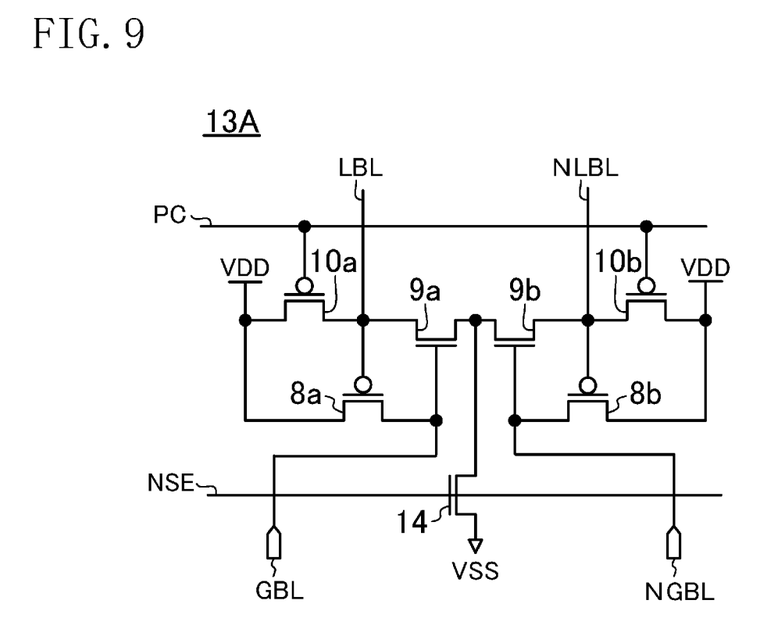
FIG. 9 is a circuit diagram showing a detailed example configuration of a local SA circuit of FIG. 8.

FIG. 8 is a block diagram showing a main configuration of a semiconductor memory device according to a third embodiment of the present disclosure. FIG. 9 is a circuit diagram showing a detailed example configuration of a local SA circuit 13A of FIG. 8. In FIG. 8, the local SA circuit 13A of FIG. 9 and a local SA control circuit 12 are blocks clearly different from those of the first embodiment of FIG. 1. The local SA circuit 13A of FIG. 9 is the above local SA circuit 2 in which an additional N-channel transistor 14 is provided at the sources of the N-channel transistors 9a and 9b, and is controlled based on a control signal NSE generated by the local SA control circuit 12.

Write operation and read operation of the semiconductor memory device thus configured can be represented by the timing chart of FIG. 4 to which only the control signal NSE<0> is added. The control signal NSE<0> is a column selection signal, and may have the same logical value as that of the precharge signal PC<0>, and may go high at the same timing as or slightly later than the precharge signal PC<0>, and go low at the same timing as that of the precharge signal PC<0>. The other control signal NSE<1> is maintained low.

According to this embodiment, in addition to the advantages of the first embodiment, the control signal NSE<1> other than the control signal NSE<0> connected to the local SA circuit 13A connected to the selected memory cell 1 is maintained low. As a result, it is possible to prevent operation of writing data on the global bit lines GBL<0> and NGBL<0> and the global bit lines GBL<1> and NGBL<1> to the local bit lines LBL<1> and NLBL<1> and the local bit lines LBL<3> and NLBL<3> connected to the non-selected memory cells 1 via the global bit lines GBL<0> and NGBL<0> and the global bit lines GBL<1> and NGBL<1> and the local SA circuits 13A. In other words, it is possible to reduce consumption of useless precharge power of the local bit line which is caused by one of the local bit line LBL<1> or NLBL<1> and the local bit line LBL<3> or NLBL<3> being pulled down by the N-channel transistor 9a or 9b of the local SA circuit 13A.

Although only the precharge signal PC<0> is high in this embodiment, all of the precharge signals PC<0>-PC<1> may be simultaneously high in order to reduce or avoid an increase in a through current during write operation. The control signal NSE may, of course, be generated by the logical product of the column selection signal and the timing control signal required for memory operation.

Fourth Embodiment

Figure 10:
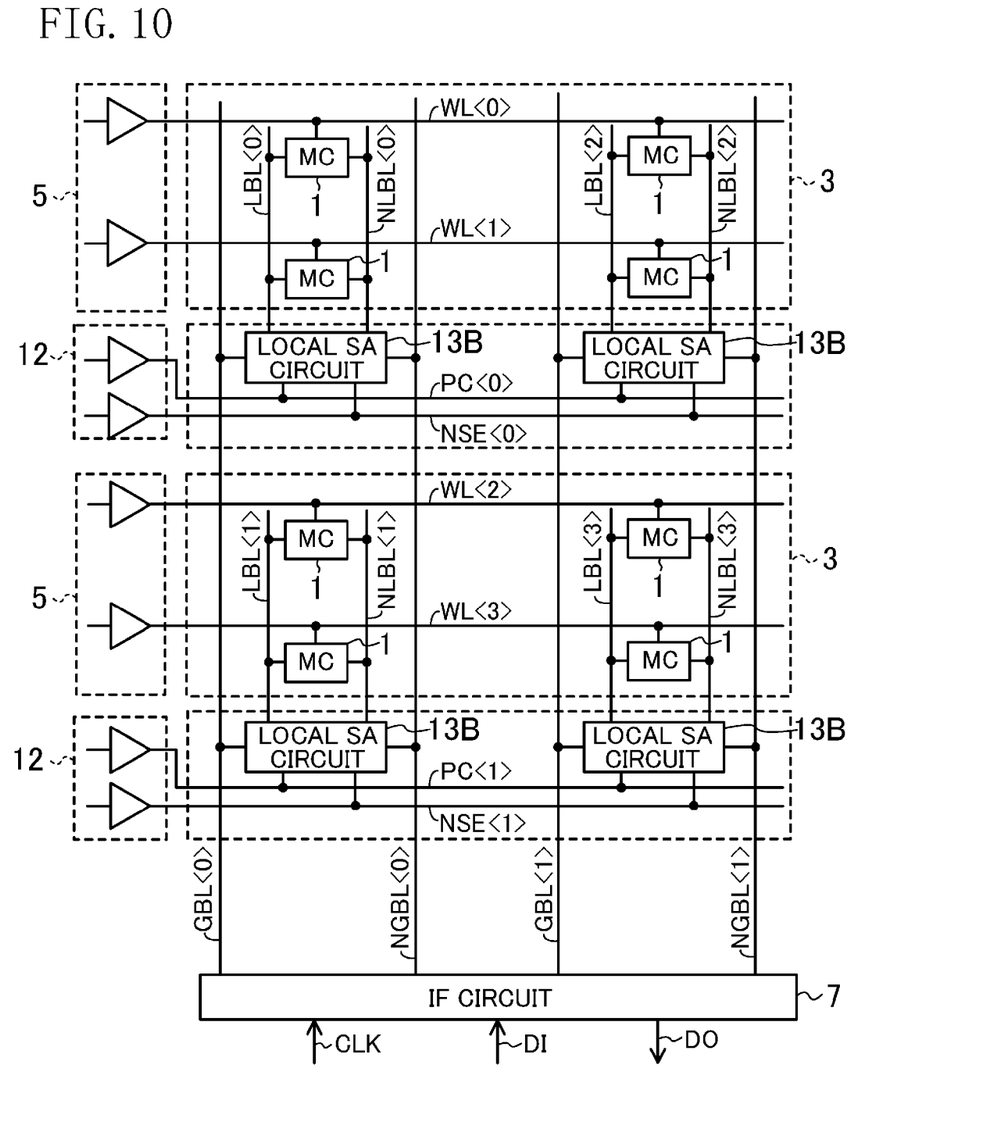
FIG. 10 is a block diagram showing a main configuration of a semiconductor memory device according to a fourth embodiment of the present disclosure.
Figure 11:
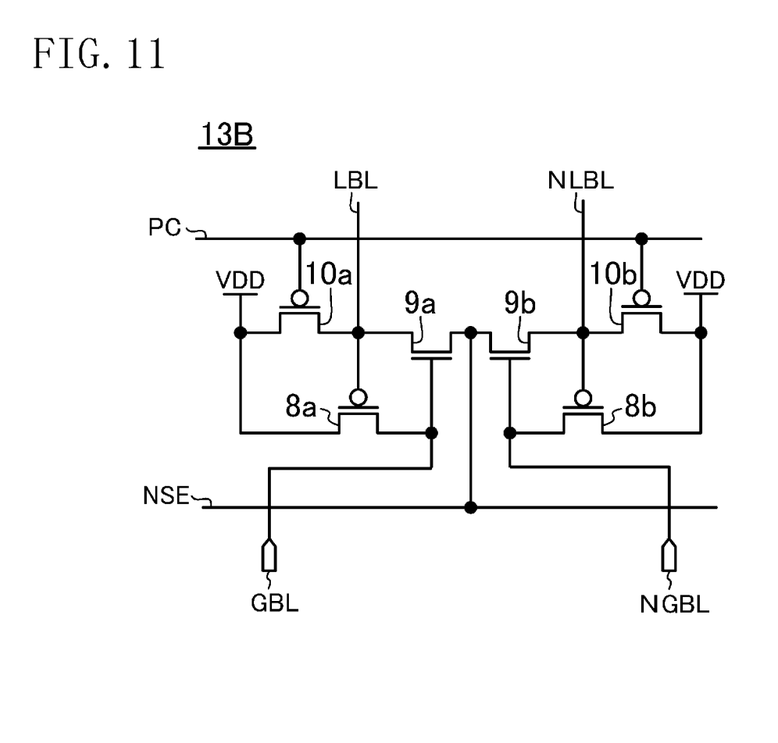
FIG. 11 is a circuit diagram showing a detailed example configuration of a local SA circuit of FIG. 10.

FIG. 10 is a block diagram showing a main configuration of a semiconductor memory device according to a fourth embodiment of the present disclosure. FIG. 11 is a circuit diagram showing a detailed example configuration of a local SA circuit 13B of FIG. 10. In FIG. 10, the local SA circuit 13B of FIG. 11 and a local SA control circuit 12 are blocks clearly different from those of the first embodiment of FIG. 1. The local SA circuit 13B of FIG. 11 is the above local SA circuit 2 in which a control signal NSE is connected to the sources of the N-channel transistors 9a and 9b.

Write operation and read operation of the semiconductor memory device thus configured can be represented by the timing chart of FIG. 4 to which only the control signal NSE<0> is added. The control signal NSE<0> is, for example, a logical signal derived from a column selection signal, and may have a logical value opposite to that of the precharge signal PC<0>, and may go low at the same timing as or slightly later than the precharge signal PC<0>, and go high at the same timing as that of the precharge signal PC<0>. The other control signal NSE<1> is maintained high.

According to this embodiment, in addition to the advantages of the first embodiment, the control signal NSE<1> other than the control signal NSE<0> connected to the local SA circuit 13B connected to the selected memory cell 1 is maintained high. As a result, it is possible to prevent operation of writing data on the global bit lines GBL<0> and NGBL<0> and the global bit lines GBL<1> and NGBL<1> to the local bit lines LBL<1> and NLBL<1> and the local bit lines LBL<3> and NLBL<3> connected to the non-selected memory cells 1 via the global bit lines GBL<0> and NGBL<0> and the global bit lines GBL<1> and NGBL<1> and the local SA circuits 13B. In other words, it is possible to reduce consumption of useless precharge power of the local bit line which is caused by one of the local bit line LBL<1> or NLBL<1> and the local bit line LBL<3> or NLBL<3> being pulled down by the N-channel transistor 9a or 9b of the local SA circuit 13B. In addition, the N-channel transistor 14 of the local SA circuit 13A of the third embodiment can be removed, whereby the area reduction effect of the first embodiment and the low power consumption effect of the third embodiment can be simultaneously achieved.

Although only the precharge signal PC<0> is high in this embodiment, all of the precharge signals PC<0>-PC<1> may be simultaneously high in order to reduce or avoid an increase in a through current during write operation.

The first-fourth embodiments have been described. The first-fourth embodiments may be implemented in combination in any manner. The configuration of FIG. 3, 9, or 11 may be used in the global SA circuit.

As described above, the semiconductor memory device of the present disclosure has the advantage that the number of components in the SA circuit can be reduced while data destruction of the memory cell is reduced or prevented, and is useful, for example, for a system LSI circuit including a large number of various memory devices.

What is claimed is:

1. A semiconductor memory device comprising:
a first and a second signal line forming a pair of signal lines;
a third and a fourth signal line forming another pair of signal lines;
a memory cell connected to the first and second signal lines; and
a sense amplifier circuit provided between the first and second signal lines and the third and fourth signal lines, wherein the sense amplifier circuit includes
a first transistor of a first conductivity type having a gate connected to a precharge signal, a source connected to a first power supply potential, and a drain connected to the first signal line,
a second transistor of the first conductivity type having a gate connected to the precharge signal, a source connected to the first power supply potential, and a drain connected to the second signal line,
a third transistor of the first conductivity type having a gate connected to the first signal line, a source connected to the first power supply potential, and a drain connected to the third signal line,
a fourth transistor of the first conductivity type having a gate connected to the second signal line, a source connected to the first power supply potential, and a drain connected to the fourth signal line,
a fifth transistor of a second conductivity type having a gate connected to the third signal line, a source connected to a second power supply potential, and a drain connected to the first signal line, and
a sixth transistor of the second conductivity type having a gate connected to the fourth signal line, a source connected to the second power supply potential, and a drain connected to the second signal line.

2. The semiconductor memory device of claim 1, wherein the first and second signal lines are local bit lines,
the third and fourth signal lines are global bit lines,
the local and global bit lines form a hierarchical bit line architecture.

3. The semiconductor memory device of claim 1, wherein the memory cell includes
a first cell transistor of the first conductivity type having a source connected to the first power supply potential, a drain connected to a first memory node, and a gate connected to a second memory node,
a second cell transistor of the first conductivity type having a source connected to the first power supply potential, a drain connected to the second memory node, and a gate connected to the first memory node,
a third cell transistor of the second conductivity type having a source connected to the second power supply potential, a drain connected to the first memory node, and a gate connected to the second memory node,
a fourth cell transistor of the second conductivity type having a source connected to the second power supply potential, a drain connected to the second memory node, and a gate connected to the first memory node,
a fifth cell transistor of the second conductivity type having a source connected to the first memory node, a drain connected to the first signal line, and a gate connected to a word line, and a sixth cell transistor of the second conductivity type having a source connected to the second memory node, a drain connected to the second signal line, and a gate connected to the word line.

4. The semiconductor memory device of claim 1, wherein the memory cell includes a first cell transistor of the first conductivity type having a source connected to the first power supply potential, a drain connected to a first memory node, and a gate connected to a second memory node, a second cell transistor of the first conductivity type having a source connected to the first power supply potential, a drain connected to the second memory node, and a gate connected to the first memory node, a third cell transistor of the second conductivity type having a source connected to the second power supply potential, a drain connected to the first memory node, and a gate connected to the second memory node, a fourth cell transistor of the second conductivity type having a source connected to the second power supply potential, a drain connected to the second memory node, and a gate connected to the first memory node, a fifth cell transistor of the second conductivity type having a source connected to the first memory node, a drain connected to the first signal line, and a gate connected to a first word line, and a sixth cell transistor of the second conductivity type having a source connected to the second memory node, a drain connected to the second signal line, and a gate connected to a second word line different from the first word line.

5. The semiconductor memory device of claim 1, wherein the sense amplifier circuit further includes a seventh transistor of the second conductivity type having a drain connected to the sources of the fifth and sixth transistors, a source connected to the second power supply potential, and a gate connected to a control signal derived from a column selection signal.

6. The semiconductor memory device of claim 1, wherein the potential value of the second power supply potential connected to the sources of the fifth and sixth transistors is controlled based on a control signal derived from a column selection signal.

* * * * *